(12) United States Patent
Golfier et al.

(10) Patent No.: US 11,181,868 B2
(45) Date of Patent: Nov. 23, 2021

(54) METHOD FOR MANUFACTURING A TIMEPIECE COMPONENT AND COMPONENT OBTAINED BY THIS METHOD

(71) Applicant: Nivarox-FAR S.A., Le Locle (CH)

(72) Inventors: Clare Golfier, La Neuveville (CH); Fatmir Salihu, Neuchatel (CH); Pierre Cusin, Villars-Burquin (CH)

(73) Assignee: Nivarox-FAR S.A., Le Locle (CH)

(*) Notice: Subject to any disclaimer, the term of this patent is extended or adjusted under 35 U.S.C. 154(b) by 0 days.

(21) Appl. No.: 17/252,572

(22) PCT Filed: Aug. 22, 2019

(86) PCT No.: PCT/EP2019/072484
§ 371 (c)(1),
(2) Date: Dec. 15, 2020

(87) PCT Pub. No.: WO2020/039032
PCT Pub. Date: Feb. 27, 2020

(65) Prior Publication Data
US 2021/0255589 A1   Aug. 19, 2021

(30) Foreign Application Priority Data
Aug. 22, 2018 (EP) ...................... 8190253

(51) Int. Cl.
*G04D 3/00* (2006.01)
*C25D 1/00* (2006.01)
(Continued)

(52) U.S. Cl.
CPC ........... *G04D 3/0087* (2013.01); *C25D 1/003* (2013.01); *G03F 7/0035* (2013.01); *G03F 7/164* (2013.01); *G04B 15/14* (2013.01)

(58) Field of Classification Search
CPC .... G04D 3/0087; C25D 1/003; G03F 7/0035; G03F 7/164
See application file for complete search history.

(56) References Cited

U.S. PATENT DOCUMENTS 9,250,533 B2 * 2/2016 Fiaccabrino ........... C25D 5/022
2006/0134819 A1 * 6/2006 Tang ................... B81C 1/00666
438/48
(Continued)

FOREIGN PATENT DOCUMENTS

CN   1652650 A   8/2005
CN   100999811 A   7/2007
(Continued)

OTHER PUBLICATIONS

Machine translation of EP 2405300 (no date).*
(Continued)

*Primary Examiner* — Amanda C. Walke
(74) *Attorney, Agent, or Firm* — Sughrue Mion, PLLC

(57) ABSTRACT

The present invention relates to a method for manufacturing metal timepiece components, characterised in that it comprises the steps of forming a multi-level photoresist mould, by means of a UV-LIGA type method, and of galvanically depositing a layer of at least one metal starting from at least two conductive layers so as to form a block that substantially reaches the top surface of the photoresist.

7 Claims, 2 Drawing Sheets

(51) Int. Cl.
  *G03F 7/16* (2006.01)
  *G03F 7/00* (2006.01)
  *G04B 15/14* (2006.01)

(56) References Cited

U.S. PATENT DOCUMENTS

| | | | |
|---|---|---|---|
| 2006/0134820 A1* | 6/2006 | Tang | B81C 1/00666 |
| | | | 438/48 |
| 2007/0227893 A1 | 10/2007 | Saucy | |
| 2011/0303546 A1 | 12/2011 | Saucy | |
| 2016/0179001 A1* | 6/2016 | Calame | G03F 7/0035 |
| | | | 428/609 |

FOREIGN PATENT DOCUMENTS

| | | |
|---|---|---|
| CN | 102124409 A | 7/2011 |
| CN | 104708930 A | 6/2015 |
| CN | 105717753 A | 6/2016 |
| CN | 107611024 A | 1/2018 |
| EP | 1 835 339 A1 | 9/2007 |
| EP | 2 053 146 A1 | 4/2009 |
| EP | 2157 476 A1 | 2/2010 |
| EP | 2 405 300 A1 | 1/2012 |
| EP | 2 405 301 A1 | 1/2012 |
| EP | 2 767 869 A1 | 8/2014 |
| JP | 2007-70678 A | 3/2007 |
| JP | 2007-247067 A | 9/2007 |
| JP | 2008-208431 A | 9/2008 |
| JP | 2014-159645 A | 9/2014 |
| KR | 10-2011-0042121 A | 4/2011 |

OTHER PUBLICATIONS

International Search Report for PCT/EP2019/072484 dated Oct. 23, 2019 [PCT/ISA/210].
Written Opinion for PCT/EP2019/072484 dated Oct. 23, 2019 [PCT/ISA/237].
International Preliminary Report on Patentability dated Jul. 8, 2020 [PCT/IPEA/409].
Communication dated May 25, 2021, from the Intellectual Property of India in application No. 202147006398.
Communication dated May 24, 2021, from the Korean Intellectual Property Office in application No. 10-2021-7004620.
Office Action dated May 31, 2021 in Chinese Application No. 201980051250.9.
Communication dated Jul. 27, 2021 from the Japanese Patent Office in Application No. 2021-501034.

* cited by examiner

METHOD FOR MANUFACTURING A TIMEPIECE COMPONENT AND COMPONENT OBTAINED BY THIS METHOD

CROSS REFERENCE TO RELATED APPLICATIONS

This application is a National Stage of International Application No. PCT/EP2019/072484 filed Aug. 22, 2019, claiming priority based on European Patent Application No. 18190253.7 filed Aug. 22, 2018.

FIELD OF THE INVENTION

The present invention relates to a method for manufacturing a multi-level metal structure using LIGA technology. The invention further relates to such a metal structure, in particular of timepiece components, obtained by this method.

BACKGROUND OF THE INVENTION

Methods that correspond to the above definition are already known. In particular, the article by A. B. Frazier et al. entitled "Metallic Microstructures Fabricated Using Photosensitive Polyimide Electroplating molds" and published in the Journal of Microelectromechanical systems (Vol. 2, N deg. 2, Jun. 1993) describes a method for manufacturing multi-level metal structures by galvanic growth in polyimide moulds produced by the photolithography of photoresist layers. This comprises the following steps of:
  creating a sacrificial metal layer and a priming layer on a substrate for a subsequent galvanic growth step,
  spreading out a layer of photosensitive polyimide,
  irradiating the polyimide layer with UV radiation through a mask that matches the contour of one level of the structure to be obtained,
  developing the polyimide layer by dissolving the non-irradiated parts so as to obtain a polyimide mould,
  filling the mould with nickel to the height of the mould by galvanic growth, and obtaining a substantially planar top surface,
  depositing a thin layer of chromium over the entire top surface by vacuum plating,
  depositing a new layer of photoresist on the chromium layer,
  irradiating the photoresist layer through a new mask that matches the contour of the next level of the structure to be obtained,
  developing the polyimide layer so as to obtain a new mould,
  filling the new mould with nickel to the height of the mould by galvanic growth,
  separating the multi-level structure and the polyimide mould from the sacrificial layer and from the substrate,
  separating the multi-level structure from the polyimide mould.

It is understood that the method described hereinabove can, in principle, be implemented in an iterative manner to obtain metal structures having more than two levels. One drawback of this method is the need to obtain a substantially planar top surface during each galvanic deposition step.

The international patent document WO2010/020515A1 describes the manufacture of a multi-level part by producing a complete photoresist mould that matches the final part to be obtained before the step of galvanically depositing the metal of the part into the mould. Only multi-level parts for which the level projections lie one inside the other can be produced using this method. This method also has certain drawbacks. In particular, galvanic growth starts everywhere and the growth fronts join and cause unwanted inclusions.

The European patent document EP2405301A1 further discloses a photoresist mould comprising at least two levels, the levels formed in the substrate only including smooth, vertical sides. The drawback of such a method is the need for substantial surplus growth to fill the second level, which can also result in unwanted inclusions in the corners of the mould.

SUMMARY OF THE INVENTION

The purpose of the present invention is to overcome the aforementioned drawbacks and others by providing a method for manufacturing multi-level metal timepiece components using LIGA technology, wherein a conductive layer is associated with a photoresist layer for each level to allow for reliable galvanic growth in the case of multi-level components having a medium to high length-to-height ratio of the second level.

Another purpose of the present invention is to provide such a method that prevents the sides from being metallised during the deposition of the one or more electrically conductive layers.

For this purpose, the invention relates to a method for manufacturing a timepiece component comprising the following steps of:
  a) taking the substrate, depositing a first electrically conductive layer thereon, and applying a first photoresist layer;
  b) irradiating the first photoresist layer through a mask defining a first level of the component and dissolving the non-irradiated areas of the photoresist layer to reveal in places the first electrically conductive layer;
  c) locally depositing a second electrically conductive layer on the irradiated areas of the first photoresist layer;
  d) applying a second photoresist layer covering the structure produced in step c);
  e) irradiating the second photoresist layer through a mask defining a second level of the component and dissolving the non-irradiated areas of the second photoresist layer to form a mould comprising a first and a second level and to reveal in places the first and the second electrically conductive layer;
  f) depositing a metal layer by electroforming in the mould from the first layer and second layer to form the component, the layer substantially reaching the top surface of the second photoresist layer;
  g) machining, using a mechanical method, the metal layer to a predefined thickness;
  h) producing, in wafer form and by mechanical machining, additional shapes (chamfers, spot faces, etc.) on the top face of the component;
  i) successively removing the substrate, the conductive layers and the photoresist to release the component.

This method thus allows multi-level parts to be produced.
According to other advantageous alternative embodiments of the invention:
  the second electrically conductive layer is deposited through a stencil mask;
  the second electrically conductive layer is implemented by comprehensive deposition on all of the exposed surfaces (including the sides), then is fully removed except from the top surface of the first photoresist layer, where it was protected by means of a resist deposited by stamping;

the second electrically conductive layer is deposited by printing an ink or a conductive resin;

said first layer and said second electrically conductive layer are of the Au, Ti, Pt, Ag, Cr or Pd type or a stack of at least two of these materials;

the substrate is made of silicon;

the first conductive layer has a thickness that lies in the range 50 nm to 500 nm;

the second conductive layer has a thickness that lies in the range 50 nm to 500 nm;

after step a) and after step d), a thickness adjustment operation is carried out on the photoresist by means of a mechanical machining operation, and the photoresist having thus undergone a thickness adjustment is heat treated.

Finally, the invention relates to a timepiece component obtained by a method according to the invention, such as a pallet-lever or an escape wheel for example.

It is thus understood that the method of the invention has a particularly advantageous application in the manufacture of components for timepieces.

BRIEF DESCRIPTION OF THE DRAWINGS

Other features and advantages of the present invention will be better understood upon reading the following detailed description of one example embodiment of a method according to the invention, this example being provided for the purposes of illustration only and not intended to limit the scope of the invention, given with reference to the accompanying drawing, wherein.

DETAILED DESCRIPTION OF A PREFERRED EMBODIMENT

Figure 1:
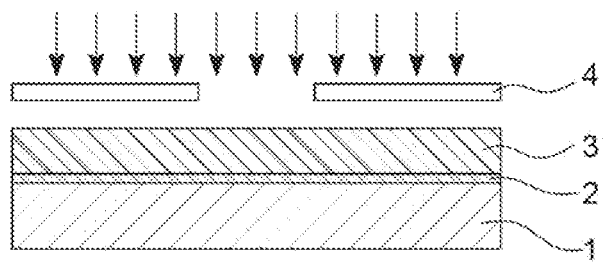
FIGS. 1 to 11 show the steps in the method of one embodiment of the invention with a view to producing a timepiece component.

The substrate 1 used in step a) of the method according to the invention is, for example, formed by a silicon substrate. During the first step a) of the method, a first conductive layer 2, i.e. a layer capable of initiating metal deposition by a galvanic approach, is deposited, for example by physical vapour deposition (PVD). Typically, the first conductive layer 2 is of the Au, Ti, Pt, Ag, Cr or Pd type (FIG. 1), or a stack of at least two of these materials, and has a thickness that lies in the range 50 nm to 500 nm. For example, the first conductive layer 2 can be formed by a chromium or titanium sub-layer covered by a layer of gold or copper.

The photoresist 3 used in this method is preferably a negative-type octofunctional epoxy-based photoresist available from Microchem under the reference SU-8, designed to polymerise under the effect of UV radiation.

According to one specific embodiment of the invention, the photoresist takes the form of a dry film, the photoresist is thus applied by lamination on the substrate 1.

Alternatively, the photoresist could be a positive photoresist designed so as to decompose under the effect of UV radiation. It is understood that the present invention is not limited to several specific types of photoresist. A person skilled in the art will be able to choose a photoresist that suits his/her needs from among all known photoresists suitable for UV photolithography.

The first photoresist layer 3 is deposited on the substrate 1 by any appropriate means, by spin coating, by a coating machine, or by spraying to the desired thickness. Typically, the photoresist thickness lies in the range 10 µm to 1000 µm, and preferably in the range 30 µm to 300 µm. Depending on the desired thickness and the deposition technique used, the first photoresist layer 3 will be deposited in one or more steps.

The first photoresist layer 3 is then heated, typically to between 90 and 120° C. for a duration that depends on the thickness deposited to remove the solvent (pre-bake step). This heating dries and hardens the photoresist.

According to an optional step of the method, the first photoresist layer 3 undergoes a thickness adjustment step wherein the photoresist is machined. In order to remove all machining marks and obtain a perfectly planar surface, the photoresist is reheated so as to "tension" the surface thereof.

Figure 2:
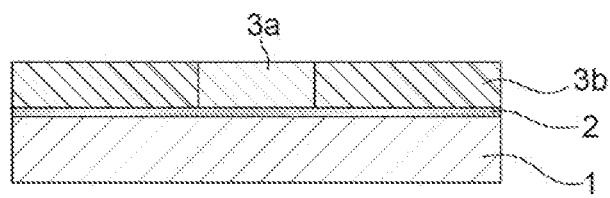
Figure 3:
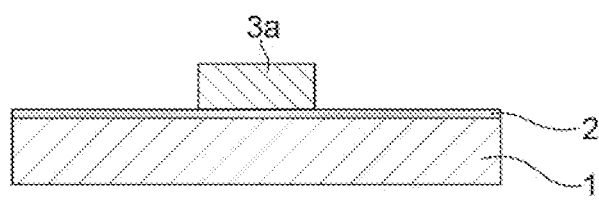

The next step b) shown in FIG. 2 consists of irradiating the first photoresist layer 3 by means of UV radiation through a mask 4 defining the first level of the component to be formed and thus photopolymerised areas 3a and non-photopolymerised areas 3b.

An annealing step (post-bake step) may be required for the first photoresist layer 3 to complete the photopolymerisation induced by the UV radiation. This annealing step is preferably carried out between 90° C. and 95° C. The photopolymerised areas 3a become insensitive to a vast majority of solvents. However, the non-photopolymerised areas could be subsequently dissolved by a solvent.

The non-photopolymerised areas 3b of the first photoresist layer 3 are then dissolved to reveal in places the first conductive layer 2 of the substrate 1. This operation is carried out by dissolving the non-photopolymerised areas 3b by means of an adequate solvent, such as PGMEA (propylene glycol methyl ether acetate). A photopolymerised photoresist mould 3a defining the first level of the component is thus produced.

Figure 4:
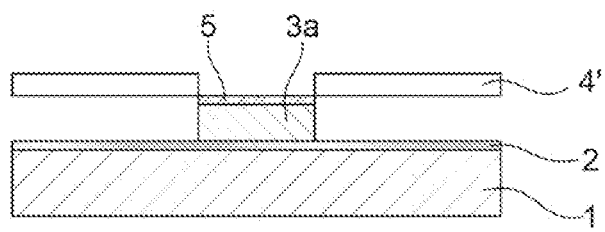

The next step c) shown in FIG. 4 consists of depositing a second conductive layer 5 on the areas 3a photopolymerised during the previous step. This second conductive layer 5 can have the same properties as the first conductive layer 2, i.e. it is of the Au, Ti, Pt, Ag, Cr or Pd type or a stack of at least two of these materials, and has a thickness that lies in the range 50 nm to 500 nm.

According to a preferred embodiment of the invention, a stencil mask is used, which is positioned via an optical alignment device. Such equipment is used to guarantee a good alignment of the mask with the geometrical configuration of the photopolymerised areas 3a on the substrate and thus guarantee a single deposition on the top surface of the first conductive layer 2 while preventing a deposition on the sides of the photopolymerised photoresist 3a since the mask is held as close as possible to the substrate 1.

According to an alternative embodiment of the invention, the second electrically conductive layer is implemented by comprehensive deposition on all of the exposed surfaces (including the sides), then is fully removed except for the top surface of the first photoresist layer, where it was protected by means of a resist deposited by stamping.

A person skilled in the art could also consider implementing a 3D printing process to deposit the second conductive layer 5.

Such solutions allow for a selective and more precise deposition of the second electrically conductive layer 5, and thus no deposition on the sides of the photopolymerised photoresist 3a.

Figure 5:
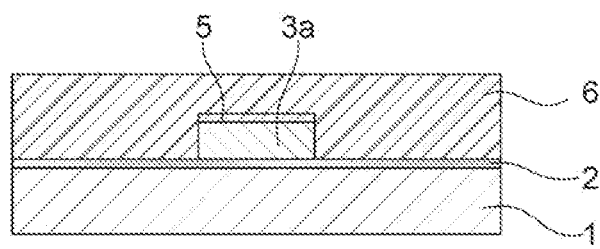

The next step d) shown in FIG. 5 consists of depositing a second photoresist layer 6 covering the structure produced in the previous step. The same photoresist is used during this step, and the thickness is greater than that deposited during step a). Generally, the thickness varies as a function of the geometrical configuration of the component that is to be obtained.

According to an optional step of the method, the second photoresist layer 6 undergoes a thickness adjustment step wherein the photoresist is mechanically machined. In order to remove all machining marks and obtain a perfectly planar surface, the photoresist is reheated so as to "tension" the surface thereof.

Figure 6:
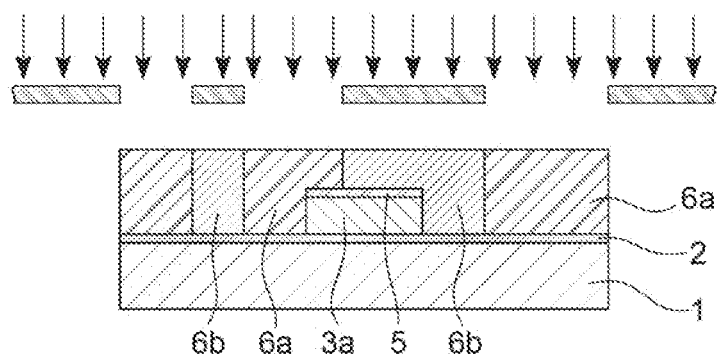
Figure 7:
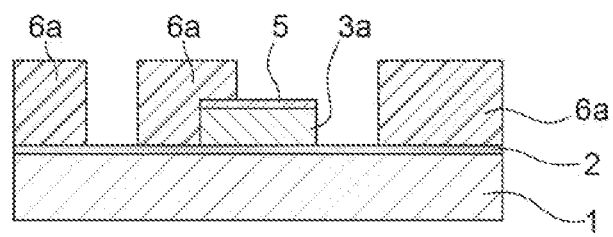

The next step e) shown in FIG. 6 consists of irradiating the second photoresist layer 6 through a mask 4" defining a second level of the component and of dissolving the non-irradiated areas 6b of the second photoresist layer 6. At the end of this step (FIG. 7), a mould is obtained comprising a first and a second level, revealing in places the first electrically conductive layer 2 and the second electrically conductive layer 5.

Figure 8:
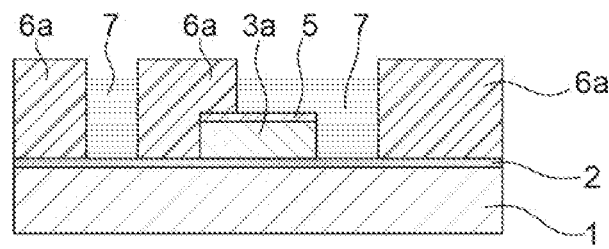

The next step f) shown in FIG. 8 consists of depositing, in the mould, by electroforming or galvanic deposition, a layer 7 of a metal from the first 2 and second electrically conductive layer 5 until forming a block preferentially reaching a height that is less than the height of the mould, procuring improved mechanical strength for subsequent machining. It goes without saying that the term 'metal' in this context includes metal alloys. Typically, the metal will be chosen from among the group comprising nickel, copper, gold or silver, and, as alloys, gold-copper, nickel-cobalt, nickel-iron, nickel-phosphorus, or even nickel-tungsten. In general, the multi-layer metal structure is entirely made of the same alloy or metal. However, the metal or alloy can also be changed during the galvanic deposition step in order to obtain a metal structure including at least two layers of different natures.

The electroforming conditions, in particular the composition of the baths, the geometrical configuration of the system, and the voltages and current densities, are chosen for each metal or alloy to be electrodeposited according to the techniques that are well known in the electroforming field.

Figure 9:
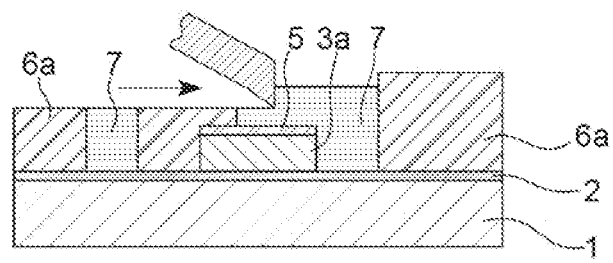

The next step g) shown in FIG. 9 consists of machining, via a mechanical method, the metal layer 7 to a thickness that is predefined by the thickness of the component to be produced.

Figure 10:
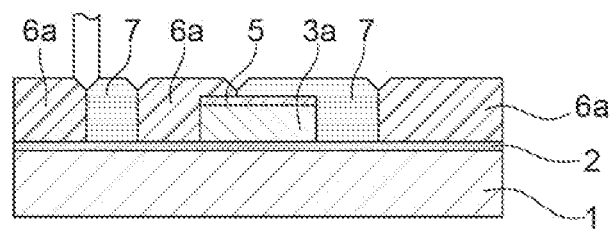
Figure 11:
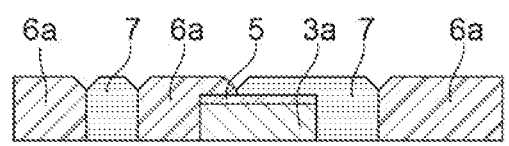

The next step h) shown in FIG. 10 consists of carrying out mechanical machining operations such as chamferings on the edges of the visible face of the component for example, or even tappings or spot faces in the component. Of course, the operations will depend on the geometrical configuration of the final component that is to be obtained.

Step i) consists of releasing the component by removing the substrate, the conductive layers or the photoresist layers via a succession of wet or dry etching steps, which operations are familiar to a person skilled in the art.
For example, the first conductive layer 2 and the substrate 1 are removed by means of wet etching, which allows the component to be released from the substrate 1 without damage. In a well-known manner, the silicon substrate can be etched with a potassium hydroxide-based solution (KOH).

At the end of this first sequence, a component is obtained set in the first and second photoresist layers, the second conductive layer 5 also remaining present in places.

A second sequence consists of removing the first 3 and the second photoresist layer 6 by oxygen plasma etching separated by wet etchings of the intermediate metal layers.

At the end of this step, the components obtained can be cleaned, and optionally reworked on a machine tool to carry out machining operations or aesthetic finalisation operations. At this stage, the parts can be used directly or can undergo various decorative and/or functional treatments, typically physical or chemical vapour depositions.

According to an optional step, after step a) and step d), a thickness adjustment operation is carried out by machining each photoresist layer 3, 6.

Advantageously, this operation allows the geometrical configuration of the parts to be precisely controlled on the scale of the substrate 1 (wafer). Once the thickness adjustment has been carried out on the photoresist, a heat treatment is carried out to remove any traces of the machining operation.

The method of the invention has a particularly advantageous application for the manufacture of components for timepieces, such as springs, pallet-levers and wheels etc. Thanks to this method, robust components can be obtained that have highly reliable geometrical configurations.

The invention claimed is:

1. A method for manufacturing a timepiece component comprising the following steps:
   a) taking a substrate, depositing a first electrically conductive layer thereon, and applying a first photoresist layer;
   b) irradiating the first photoresist layer through a mask defining a first level of the component and dissolving a non-irradiated areas of the photoresist layer to reveal in places the first electrically conductive layer and to form a photopolymerised photoresist mould defining the first level of the component;
   c) locally depositing a second electrically conductive layer on the photopolymerised photoresist of the first photoresist layer, the second electrically conductive layer being deposited through a stencil mask or by printing an ink or a conductive resin;
   d) applying a second photoresist layer covering the structure produced in step c);
   e) irradiating the second photoresist layer through a mask defining a second level of the component and dissolving the non-irradiated areas of the second photoresist layer to form a mould comprising a first and a second level and to reveal in places the first and the second electrically conductive layer;
   f) depositing a metal layer by electroforming in the mould from the first layer and second layer to form the component, the layer substantially reaching the top surface of the second photoresist layer;
   g) machining, using a mechanical method, the metal layer to a predefined thickness;
   h) producing, in wafer form and by mechanical machining, additional shapes on the top face of the component; and
   i) successively removing the substrate, the conductive layers and the photoresist to release the component.

2. The method according to claim 1, wherein said first layer and said second electrically conductive layer are of the type Au, Ti, Pt, Ag, Cr or Pd.

3. The method according to claim 1, wherein the substrate is made of silicon.

4. The method according to claim 1, wherein the first conductive layer has a thickness that lies in the range 50 nm to 500 nm.

5. The method according to claim 1, wherein the second conductive layer has a thickness that lies in the range 50 nm to 500 nm.

6. The method according to claim 1, wherein:
- after step a) and after step d), a thickness adjustment operation is carried out on the photoresist by means of a mechanical machining operation;
- the photoresist having undergone the thickness adjustment is heat treated.

7. A timepiece component obtained by a method according to claim 6.

* * * * *